US011843370B2

(12) United States Patent
Hayashi

(10) Patent No.: US 11,843,370 B2
(45) Date of Patent: Dec. 12, 2023

(54) SWITCHING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tsuneyuki Hayashi, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 17/940,590

(22) Filed: Sep. 8, 2022

(65) Prior Publication Data
US 2023/0268918 A1 Aug. 24, 2023

(30) Foreign Application Priority Data
Feb. 22, 2022 (JP) ................. 2022-025841

(51) Int. Cl.
*H03K 17/687* (2006.01)
*H03K 3/356* (2006.01)
*H02M 3/158* (2006.01)
*H03K 19/20* (2006.01)

(52) U.S. Cl.
CPC .......... *H03K 17/687* (2013.01); *H02M 3/158* (2013.01); *H03K 3/356* (2013.01); *H03K 19/20* (2013.01)

(58) Field of Classification Search
CPC ..... H02M 3/158; H03K 17/687; H03K 19/20; H03K 3/356; H03K 17/04106; H03K 17/302; H03K 2217/0063

USPC .......................................... 327/427
See application file for complete search history.

(56) References Cited

U.S. PATENT DOCUMENTS 5,327,124 A * 7/1994 Funamoto .......... G11B 20/1426
                                                    341/52
10,651,846 B2   5/2020 Fukushima et al.
11,522,535 B2 * 12/2022 Otsu .................... H03K 17/687
2022/0173586 A1 * 6/2022 Hayashi ........... H03K 17/08122

FOREIGN PATENT DOCUMENTS

JP   2014-138303 A   7/2014
JP   2019-134622 A   8/2019
JP   2020-099139 A   6/2020

* cited by examiner

*Primary Examiner* — Menatoallah Youssef
*Assistant Examiner* — Colleen J O Toole
(74) *Attorney, Agent, or Firm* — Kim & Stewart LLP

(57) ABSTRACT

A gate of the first p-type MOS transistor and the first and second control circuits are electrically coupled to a first node. The first control circuit lowers a voltage or the first node between a first time and a second time at which the first p-type MOS transistor is off. The second control circuit lowers the voltage of the first node between a third time and a fourth time at which the first p-type MOS transistor is on. The second time is later than the first time. The fourth time is later than the second and third times. The first p-type MOS transistor is turned on during a first period. A voltage decrease amount of the first node per unit time in the first control circuit is greater than that in the second control circuit.

9 Claims, 12 Drawing Sheets

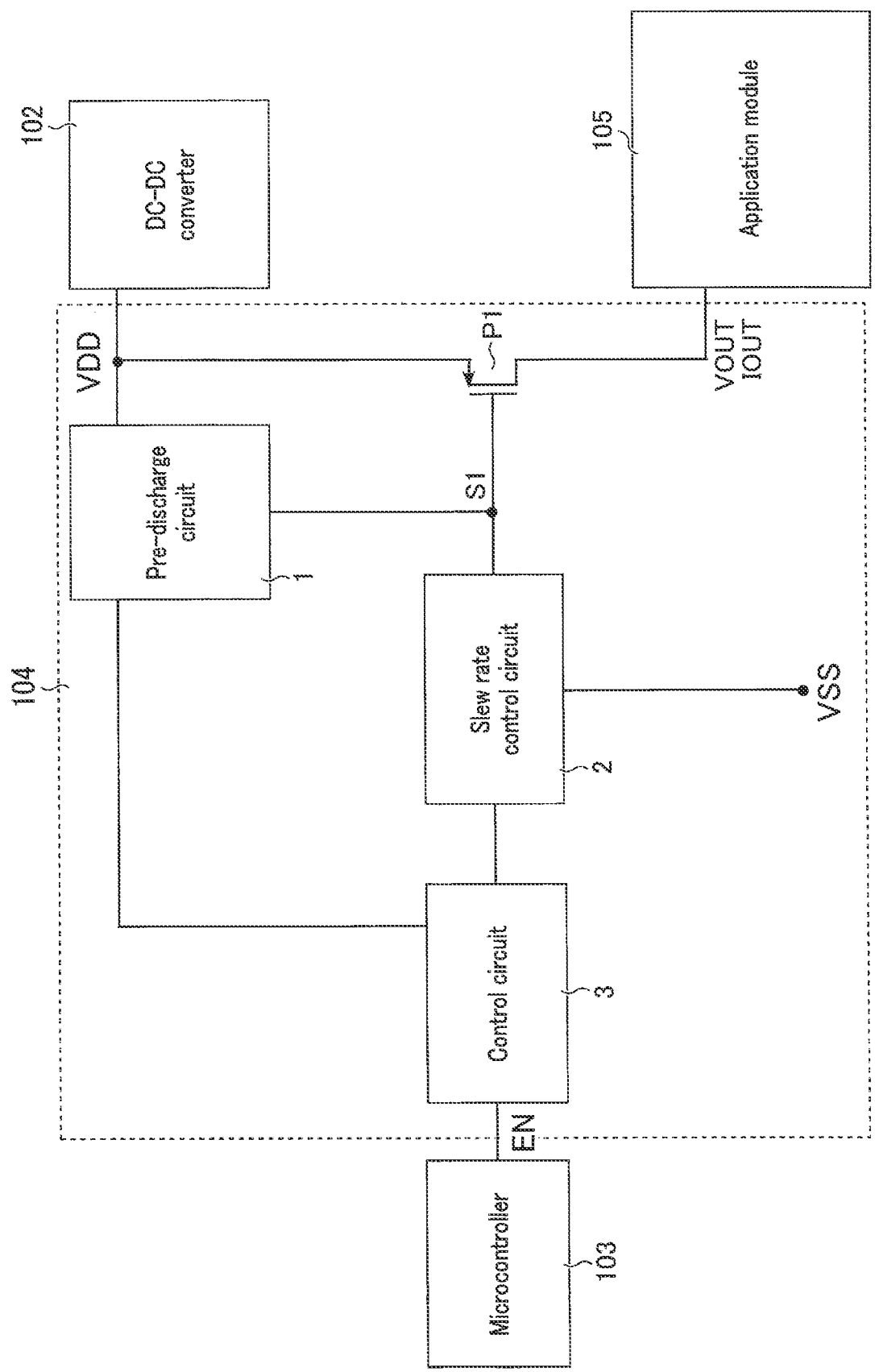
F I G. 2

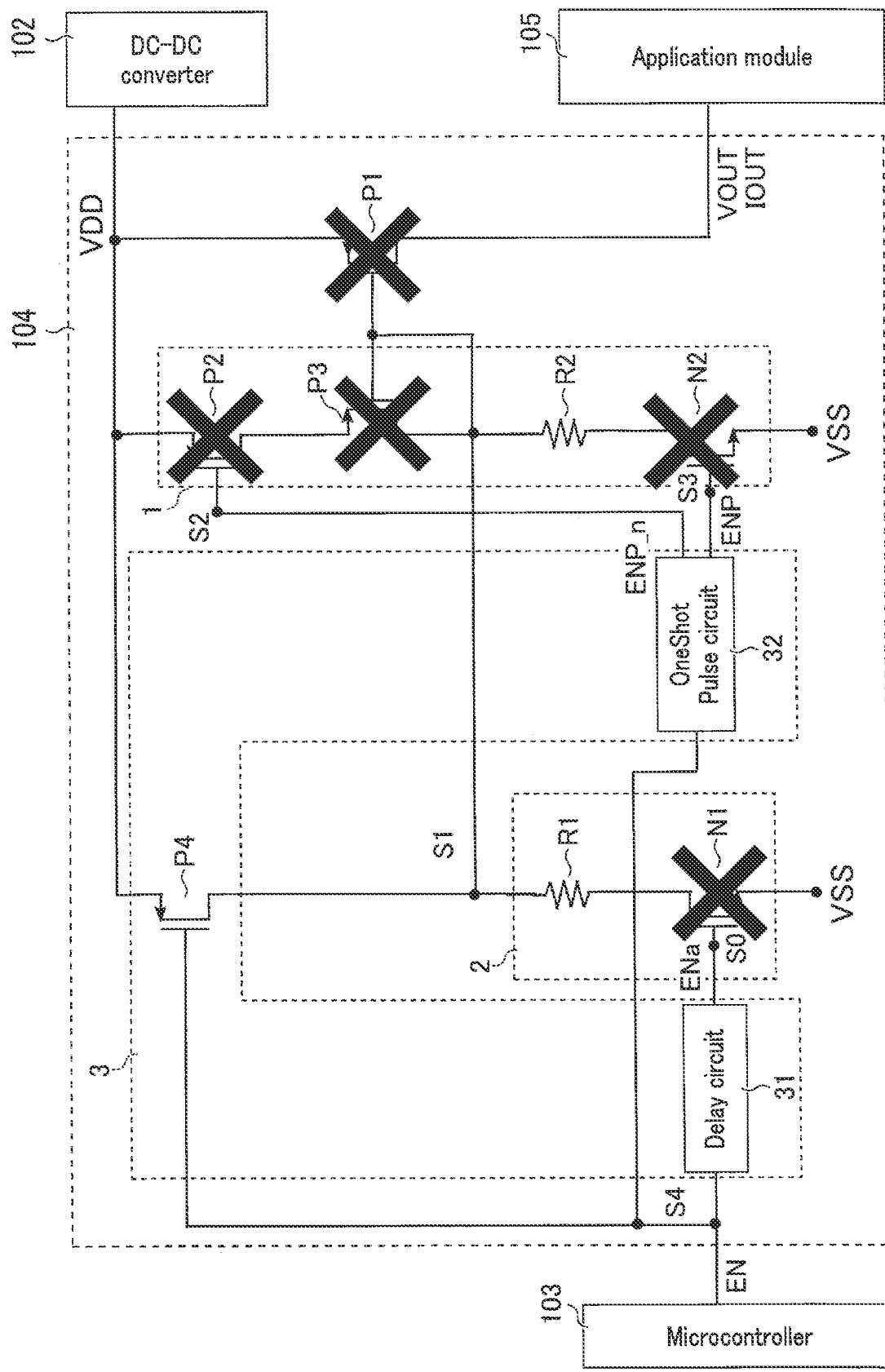
F I G. 5

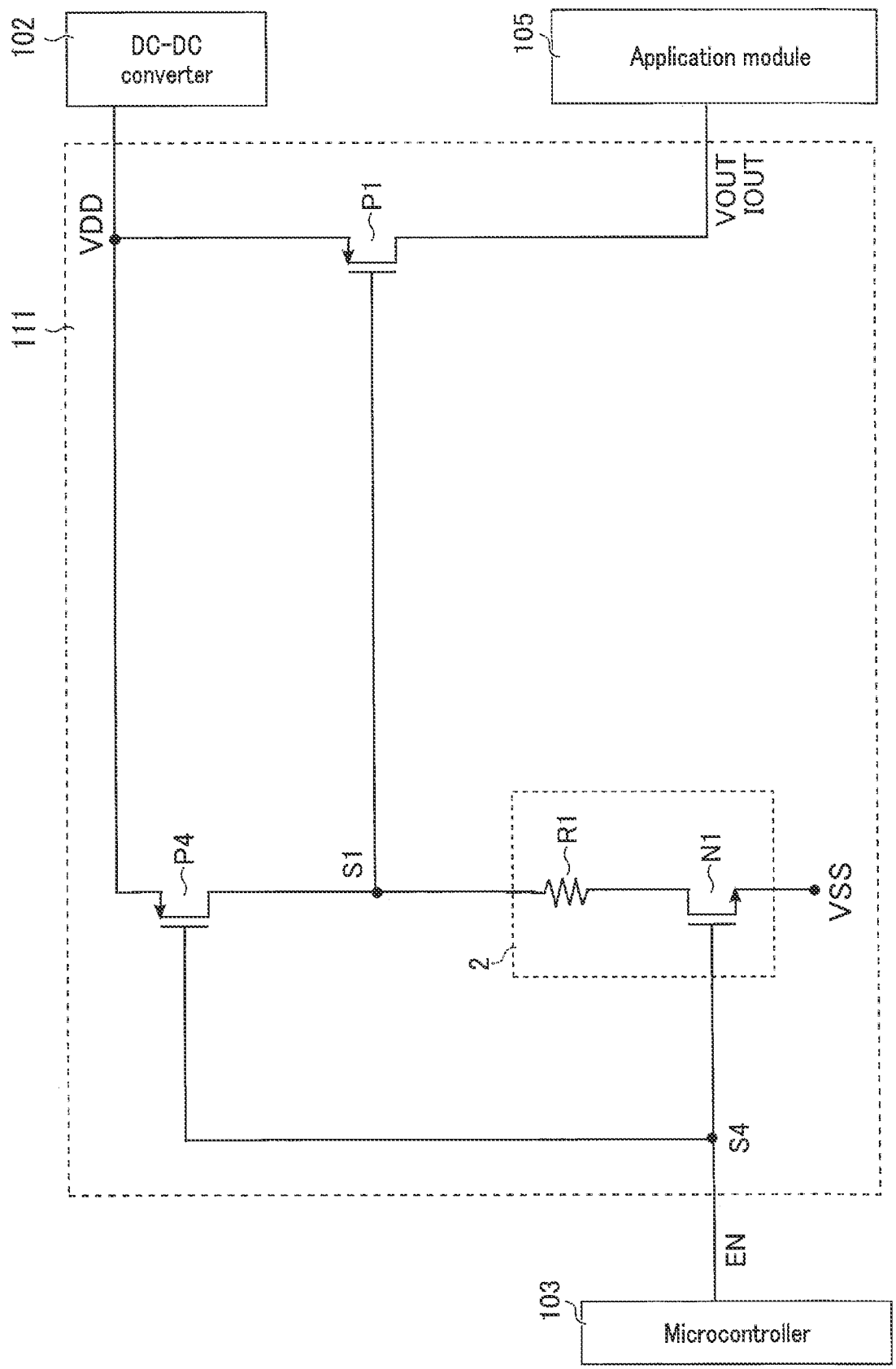
F I G. 8

SWITCHING DEVICE

CROSS-REFERENCE TO RELATED APPLICATIONS

This application is based upon and claims the benefit of priority from Japanese Patent Application No. 2022-025841, filed Feb. 22, 2022, the entire contents of which are incorporated herein by reference.

FIELD

Embodiments described herein relate generally to a switching device.

BACKGROUND

A switching device is used for, for example, controlling electric power. Such a switching device is required to prevent a current from flowing out abruptly, and to perform activation quickly.

BRIEF DESCRIPTION OF THE DRAWINGS

FIG. 2 is a block diagram showing a configuration example of a load switch IC according to the first embodiment.

FIG. 4 is a timing chart showing states of signals upon switching of the load switch IC according to the first embodiment from off to on.

FIG. 5 is a circuit diagram showing an example of a state of coupling of the load switch IC according to the first embodiment during a period from time t0 to time t1.

FIG. 8 is a circuit diagram showing an example of a circuit configuration in a load switch IC according to a comparative example of the first embodiment.

FIG. 9 is a timing chart showing states of signals upon switching of the load switch IC according to the comparative example of the first embodiment from off to on.

FIG. 10 is a timing chart showing, along a timeline, states of signals upon switching of a load switch IC according to a modification of the first embodiment from off to on.

FIG. 12 is a timing chart showing states of signals upon switching of the load switch IC according to the second embodiment from off to on.

DETAILED DESCRIPTION

A switching device according to an embodiment includes a first p-type MOS transistor, a first control circuit, and a second control circuit. The first p-type MOS transistor includes a gate coupled to a first node. The first control circuit and the second control circuit are electrically coupled to the first node. The first control circuit is configured to lower a voltage of the first node from a first time to a second time, the first p-type MOS transistor is at an off state at the first time. The second control circuit is configured to lower the voltage of the first node during a first period from a third time to a fourth time, the first p-type MOS transistor is at an on state at the fourth time. The second time is later than the first time. The fourth time is later than the second time and the third time. The first p-type MOS transistor is brought to an on state during the first period. An amount of the voltage of the first node lowered per unit time in the first control circuit is greater than that in the second control circuit. The first control circuit includes second and third p-type MOS transistors and a first n-type MOS transistor. The second p-type MOS transistor includes one end coupled to a voltage source. The third p-type MOS transistor is coupled between another end of the second p-type MOS transistor and the first node, and includes a gate coupled to the first node. The first n-type MOS transistor is electrically coupled between the first node and a first power source which is of a voltage lower than a voltage of the voltage source.

Hereinafter, embodiments will be described with reference to the accompanying drawings. Each embodiment illustrates a device and a method for embodying the technical idea of the invention. The drawings are either schematic or conceptual, and the dimensions, ratios, etc. of each drawing are not necessarily identical to the actual ones. The entire description of an embodiment is applicable as a description of another embodiment, unless otherwise expressly or implicitly excluded. The technical idea of the present invention is not designated by the shape, structure, arrangement, etc. of the components.

In the description that follows, components having an approximately identical function and configuration will be assigned an identical symbol. A numeral that follows letters constituting a reference symbol is used to distinguish between components referred to by reference symbols including the same letters and having a similar configuration. If components represented by reference symbols including the same letters need not be distinguished from each other, such components are referred to by reference symbols including only the same letters.

<1> First Embodiment

<1-1> Configuration (Structure)

Hereinafter, a load switch IC 104 according to a first embodiment will be described.

<1-1-1> Configuration of System 300

Figure 1:
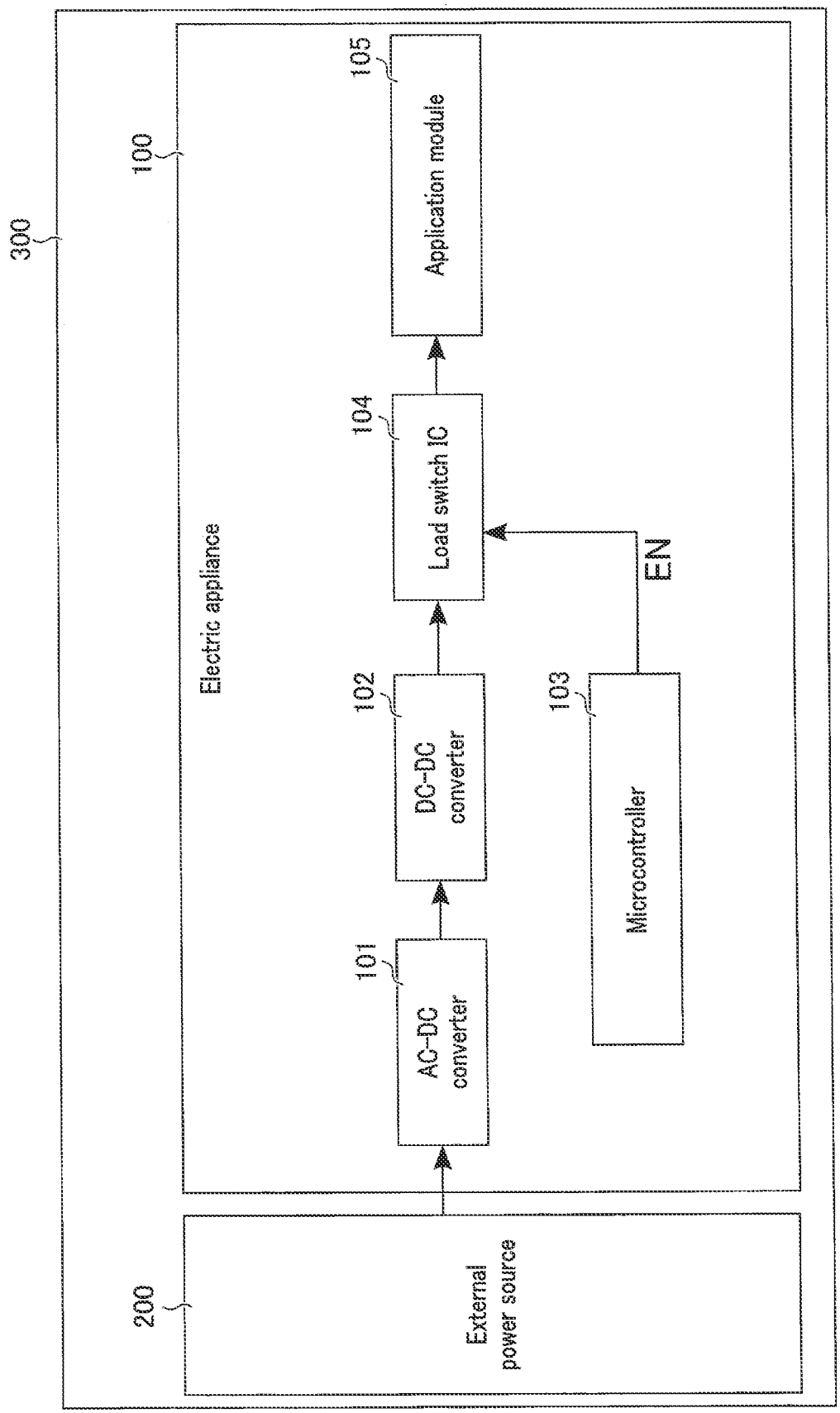
FIG. 1 is a block diagram showing a configuration example of a system according to a first embodiment.

FIG. 1 is a block diagram showing a configuration example of a system 300 according to a first embodiment. The system 300 can be realized as a system in a case where various electric appliances are connected with an external power supply. As shown in FIG. 1, the system 300 includes an external power source 200 and an electric appliance 100. The external power source 200 externally supplies electric power to the electric appliance 100.

The electric appliance 100 may be, for example, an electric appliance of various types coupled to an external power supply, such as a smartphone, a tablet, etc. The electric appliance 100 includes an AC-DC converter 101, a DC-DC converter 102, a microcontroller 103, a load switch IC 104, and an application module 105.

The AC-DC converter 101 converts an AC voltage supplied from the external power source 200 into a DC voltage. The DC-DC converter 102 converts the DC voltage supplied from the AC-DC converter 101 into a DC voltage suitable for operating the application module 105. The DC voltage suitable for operating the application module 105 is, for example, an input voltage VDD.

The microcontroller 103 controls the electric appliance 100. The microcontroller 103 operates based on a code (program) stored in a storage medium. The microcontroller 103 generates a control signal EN based on the code. The microcontroller 103 outputs the generated control signal EN to the load switch IC 104 (switching device). The control signal EN includes a signal for operating the electric appliance 100. The electric appliance 100 performs switching between on and off based on, for example, the control signal EN.

The load switch IC 104 is supplied with an input voltage VDD from the DC-DC converter 102. The load switch IC 104 receives the control signal EN from the microcontroller 103. Based on the control signal EN, the load switch IC 104 controls supply of a power source to the application module 105. That is, the load switch IC 104 is arranged between the external power source 200 and the application module 105 in the system 300, and controls the power source of the application module 105. Details of the load switch IC 104 will be discussed later.

<1-1-2> Configuration of Load Switch IC 104

FIG. 2 is a block diagram showing a configuration example of the load switch IC 104 according to the first embodiment. As shown in FIG. 2, the load switch IC 104 includes a switching PMOS transistor P1, a pre-discharge circuit 1, a slew rate control circuit 2, and a control circuit 3.

The switching PMOS transistor P1 is a transistor functioning as a switch that controls whether or not to apply a voltage to the application module 105. One end of the switching PMOS transistor P1 is coupled to a node of a power-supply voltage VDD. A voltage VDD of a certain magnitude is applied to the node of the power-supply voltage VDD by, for example, the DC-DC converter 102. The other end of the switching PMOS transistor P1 is coupled to the application module 105. A gate of the switching PMOS transistor P1 is coupled to a node S1.

If the switching PMOS transistor P1 is at an off state, a voltage is not applied to the application module 105. If the switching PMOS transistor P1 is at an on state, an output voltage VOUT is applied to the application module 105, and an output current IOUT flows thereto.

The control circuit 3 controls the pre-discharge circuit 1 and the slew rate control circuit 2 based on the control signal EN received from the microcontroller 103.

The pre-discharge circuit 1 performs control of the voltage applied to the node S1, which is coupled to the gate of the switching PMOS transistor P1. The pre-discharge circuit 1 lowers a potential of the node S1 from the input voltage VDD to an activation voltage Von. The activation voltage Von is a voltage smaller than the power-supply voltage VDD by a threshold voltage Vthp of the switching PMOS transistor P1. In other words, (activation voltage Von)=(power-supply voltage VDD)−(threshold voltage Vthp) is satisfied. That is, the potential of the node S1 is lowered by the pre-discharge circuit 1 to a potential (=activation voltage Von) at which the switching PMOS transistor P1 is turned on. When the potential of the node S1 reaches the activation voltage Von, the switching PMOS transistor P1 is brought to an on state. Details of the pre-discharge circuit 1 will be discussed later.

The slew rate control circuit 2 controls a current flowing to the application module 105. The current flowing to the application module 105 may be referred to as an "output current IOUT". The slew rate control circuit 2 further lowers the potential of the node S1, which has been lowered to the activation voltage Von by the pre-discharge circuit 1. At this time, the slew rate control circuit 2 applies a gradually changing voltage to the node S1, causing the potential of the node S1 to be gradually lowered. With the potential of the node S1 being gradually lowered, the current flowing through the application module 105 gradually increases.

If the output current IOUT becomes large abruptly, a breakdown, etc. of the application module 105 may be caused. Accordingly, the slew rate control circuit 2 applies a gradually changing voltage to the node S1 to prevent a current from flowing to the application module 105 abruptly.

Figure 3:
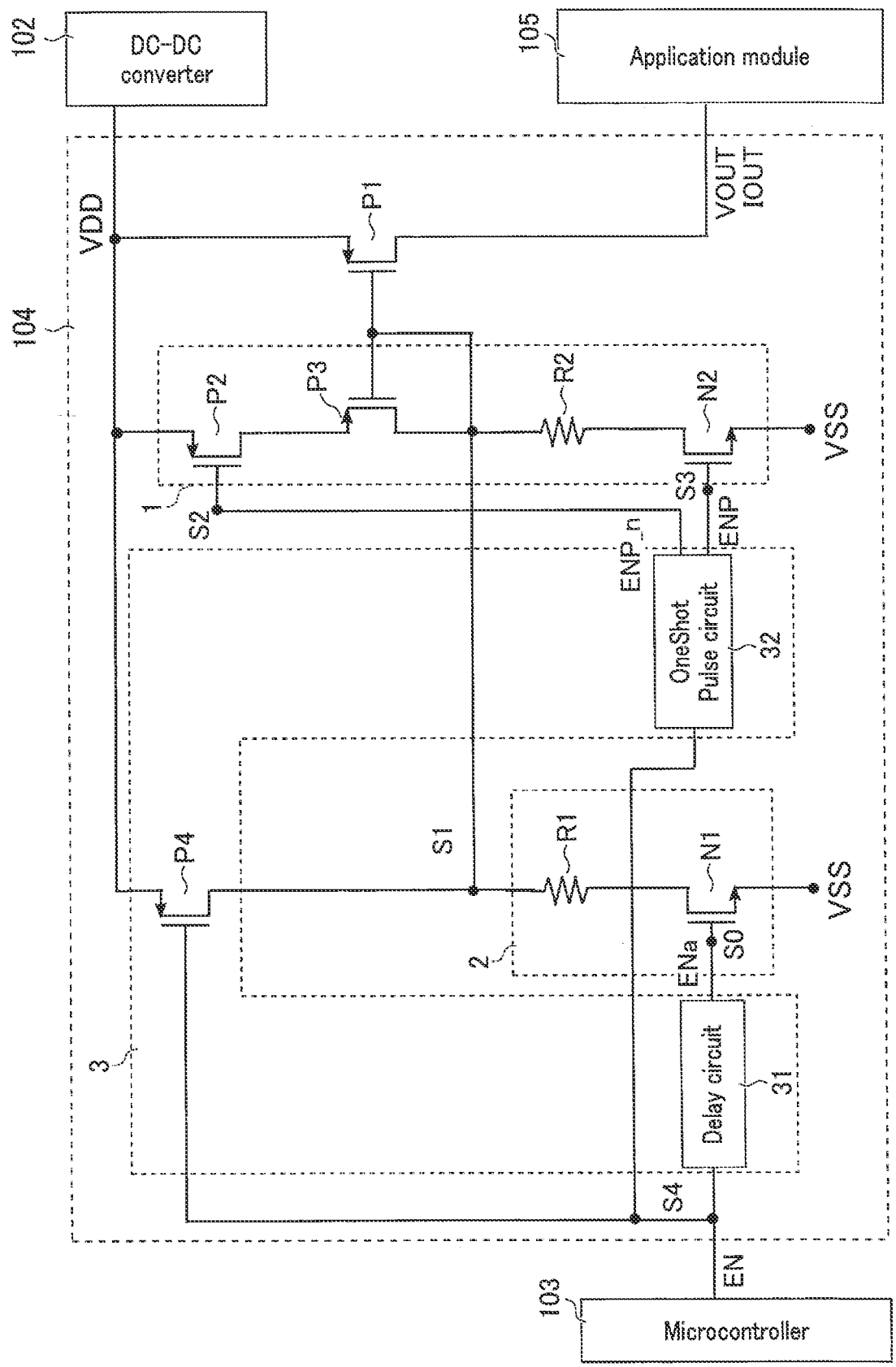
FIG. 3 is a circuit diagram showing an example of a circuit configuration of the load switch IC according to the first embodiment.

FIG. 3 shows a specific circuit configuration of the load switch IC 104 according to the first embodiment described with reference to FIG. 2. As shown in FIG. 3, the slew rate control circuit 2 includes a resistance R1 and an NMOS transistor N1. One end of the resistance R1 is coupled to the node S1. The other end of the resistance R1 is coupled to one end of the NMOS transistor N1. The other end of the NMOS transistor N1 is coupled to a node of a ground voltage VSS (e.g., 0V). A gate of the NMOS transistor N1 is coupled to a node S0.

The pre-discharge circuit 1 includes a resistance R2, an NMOS transistor N2, and PMOS transistors P2 and P3. One end of the PMOS transistor P2 is coupled to a node of the power-supply voltage VDD. The other end of the PMOS transistor P2 is coupled to one end of the PMOS transistor P3. A gate of the PMOS transistor P2 is coupled to a node S2.

The other end of the PMOS transistor P3 is coupled to one end of the resistance R2. A gate of the PMOS transistor P3 is coupled to the node S1. The other end of the PMOS transistor P3 is coupled to the node S1. That is, the PMOS transistor P3 is diode-coupled. The PMOS transistor P3 configures a current mirror together with the switching PMOS transistor P1.

A threshold voltage of the PMOS transistor P3 is, for example, the threshold voltage Vthp which is the same as the threshold voltage of the switching PMOS transistor P1. The threshold voltage of the PMOS transistor P3 may be set to be a value lower than the threshold voltage Vthp, and such an example will be shown in a modification.

The other end of the resistance R2 is coupled to one end of the NMOS transistor N2. The other end of the NMOS transistor N2 is coupled to a node of the ground voltage VSS. A gate of the NMOS transistor N2 is coupled to a node S3.

The control circuit 3 includes a PMOS transistor P4, a delay circuit 31, and a one-shot pulse circuit 32. Details of signals will be discussed later with reference to FIG. 5.

The node S4 receives the control signal EN from the microcontroller 103. One end of the PMOS transistor P4 is coupled to a node of the power-supply voltage VDD. The other end of the PMOS transistor P4 is coupled to the node S1. A gate of the PMOS transistor P4 receives the control signal EN from the node S4. The PMOS transistor P4 is brought to an on state if the control signal EN is at a low level, and is brought to an off state if the control signal EN is at a high level.

The delay circuit 31 controls the slew rate control circuit 2. An input end of the delay circuit 31 receives the control signal EN from the node S4. The delay circuit 31 generates a delay signal ENa from the received control signal EN. The delay signal ENa is a signal delayed from the control signal EN by a delay time Δt, which is a certain period of time, upon switching of the control signal EN from a low level to a high level. The control signal EN is output without such a delay upon switching of the control signal EN from a high level to a low level. An output end of the delay circuit 31 transmits the delay signal ENa to the node S0. By setting the delay time Δt, the delay circuit 31 controls a period of time over which the NMOS transistor N1 of the slew rate control circuit 2 is on. The NMOS transistor N1 is brought to an on state if the delay signal ENa is at a high level, and is brought to an off state if the delay signal ENa is at a low level.

The one-shot pulse circuit 32 controls the pre-discharge circuit 1. An input end of the one-shot pulse circuit 32 receives the control signal EN from the node S4. The one-shot pulse circuit 32 generates a pulse signal ENP based on the received control signal EN. The pulse signal ENP is a one-shot pulse signal which is turned on upon switching of the control signal EN from a low level to a high level. A pulse width of the one-shot pulse signal is, for example, a delay time Δt. The one-shot pulse circuit 32 can be set to have the pulse width of the pulse signal ENP of any width.

A first output end of the one-shot pulse circuit 32 outputs a pulse signal ENP_n to the node S2. A second output end of the one-shot pulse circuit 32 outputs the pulse signal ENP to the node S3. The pulse signal ENP_n is an inversion signal of the pulse signal ENP.

By setting the pulse widths of the pulse signals ENP and ENP_n, the one-shot pulse circuit 32 controls a period of time over which the NMOS transistor N2 and the PMOS transistor P2 of the pre-discharge circuit 1 are on. The NMOS transistor N2 and the PMOS transistor P2 are turned on only while a pulse is being output.

<1-2> Operation

Figure 4:
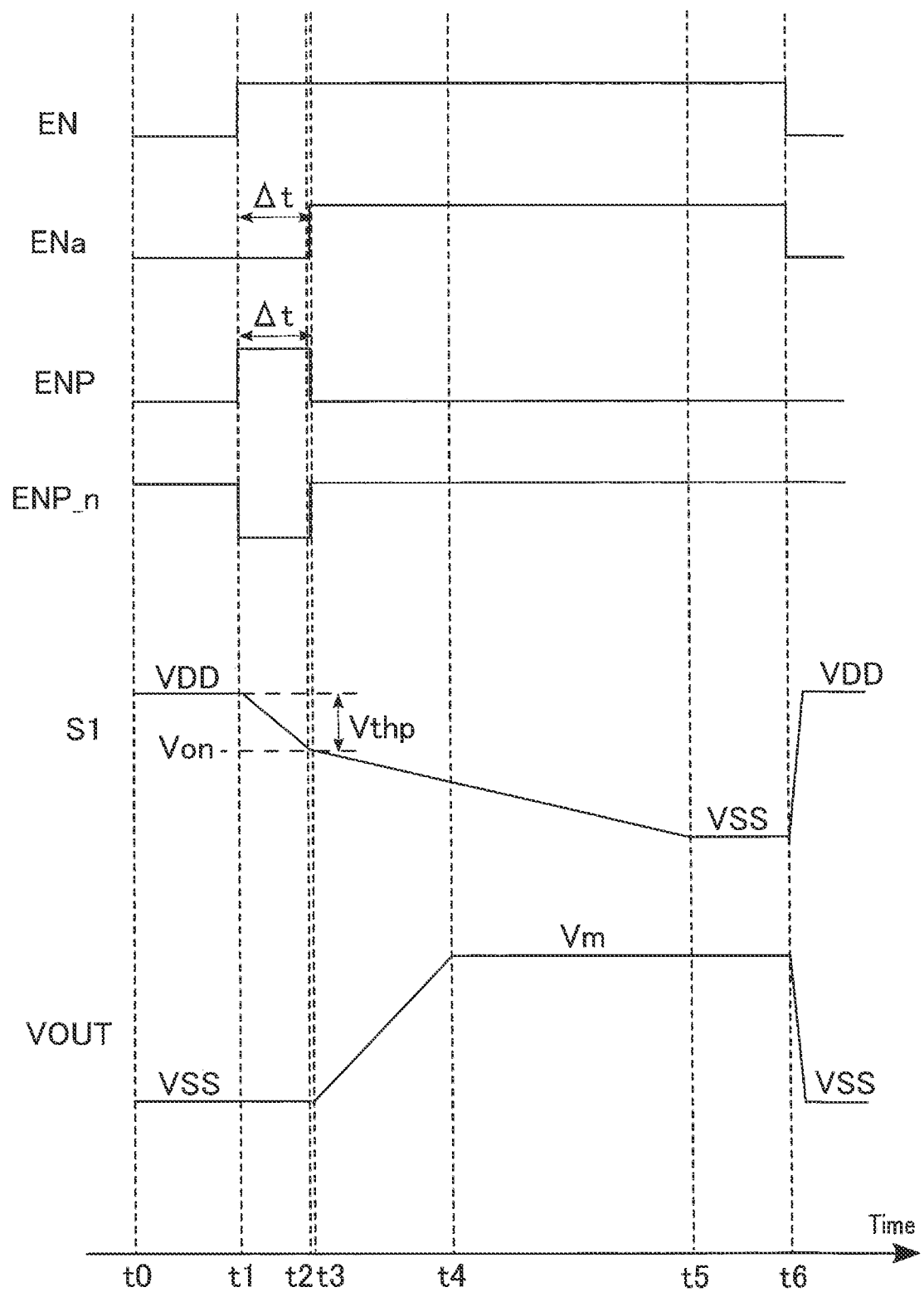

FIG. 4 is a timing chart showing, along a timeline, states of some signals upon switching of the load switch IC 104 of the first embodiment from off to on. In the timing chart of FIG. 4, the control signal EN, the delay signal ENa, the pulse signal ENP, the pulse signal ENP_n, the potential of the node S1, and the output voltage VOUT are shown.

At time t0, the microcontroller 103 commences control to turn on the application module 105. At time to, the control signal EN is at a low level. At time to, since the control signal EN is at a low level, the delay circuit 31 maintains the delay signal ENa at a low level. Since the control signal EN is at a low level, the one-shot pulse circuit 32 maintains the pulse signal ENP at a low level, and maintains the pulse signal ENP_n at a high level. At time t0, the potential of the node S1 is the power-supply voltage VDD. At time t0, the output voltage VOUT is the ground voltage VSS.

An example of coupling of the load switch IC 104 at this time is shown in FIG. 5. FIG. 5 is a circuit diagram showing an example of a state of coupling of the load switch IC 104 according to the first embodiment during the period from time t0 inclusive to time t1. An operation at time t1 will be discussed later. Over the period from time t0 inclusive to time t1, since the control signal EN is at a low level, the PMOS transistor P4 is at an on state, as shown in FIG. 5.

Over the period from time t0 inclusive to time t1, since the delay signal ENa is at a low level, the NMOS transistor N1 is at an off state.

Over the period from time t0 inclusive to time t1, since the pulse signal ENP is at a low level, the NMOS transistor N2 is at an off state. Similarly, since the pulse signal ENP_n is at a high level, the PMOS transistor P2 is at an off state.

Based on the above-described states of the PMOS transistors P2, P3, and P4 and the NMOS transistors N1 and N2, the potential of the node S1 is the power-supply voltage VDD over the period from time t0 inclusive to time t1. Since the potential of the node S1 is the power-supply voltage VDD, the switching PMOS transistor P1 and the PMOS transistor P3 are at an off state over the period from time t0 inclusive to time t1.

Since the switching PMOS transistor P1 is at an off state, a voltage from the DC-DC converter 102 is not applied to the application module 105 over the period from time t0 inclusive to time t1. At this time, the output voltage VOUT is, for example, the ground voltage VSS.

At time t1, the microcontroller 103 starts shifting the control signal EN to a high level, as shown in FIG. 4. The delay signal ENa is a signal delayed from the control signal EN by a delay time Δt upon switching of the control signal EN switches from a low level to a high level, as described above. The delay signal ENa is at a low level at time t1.

Based on the control signal EN shifting to a high level, the one-shot pulse circuit 32 brings the pulse signal ENP to a high level. After the pulse signal ENP is brought to a high level, the one-shot pulse circuit 32 maintains the pulse signal ENP at a high level for the delay time Δt. The delay time Δt is equal to the period from time t1 to time t2. That is, the pulse signal ENP maintains a high level over the period from time t1 to time t2, which is later than the time t1 by the delay time Δt.

On the other hand, based on the control signal EN being brought to a high level, the one-shot pulse circuit 32 brings the pulse signal ENP_n to a low level. After the pulse signal ENP_n is brought to a low level, the one-shot pulse circuit 32 maintains the pulse signal ENP_n at a low level for the delay time Δt. That is, the pulse signal ENP_n maintains a low level over the period from time t1 to time t2.

At time t1, the pulse signal ENP starts shifting to a high level. Based on the pulse signal ENP shifting to a high level, the NMOS transistor N2 is brought to an on state. Thereby, at time t1, the pre-discharge circuit 1 commences operating, and the potential of the node S1 starts decreasing from the power-supply voltage VDD. In other words, the potential of the node S1 starts to fall at time t1. At this time, the potential of the node S1 decreases by, for example, a certain magnitude per unit of time. The degree of decrease of the potential of the node S1 depends on the magnitude of the resistance R2 and the driving capability of the NMOS transistor N2. The potential of the node S1 does not reach the activation voltage Von until time t2.

The potential of the node S1 starts to decrease at time t1; however, the potential of the node S1 does not reach the activation voltage Von during the period from time t1 to time t2. Accordingly, during the period from time t1 to time t2, the switching PMOS transistor P1 is at an off state, and the output voltage VOUT is the ground voltage VSS.

Figure 6:
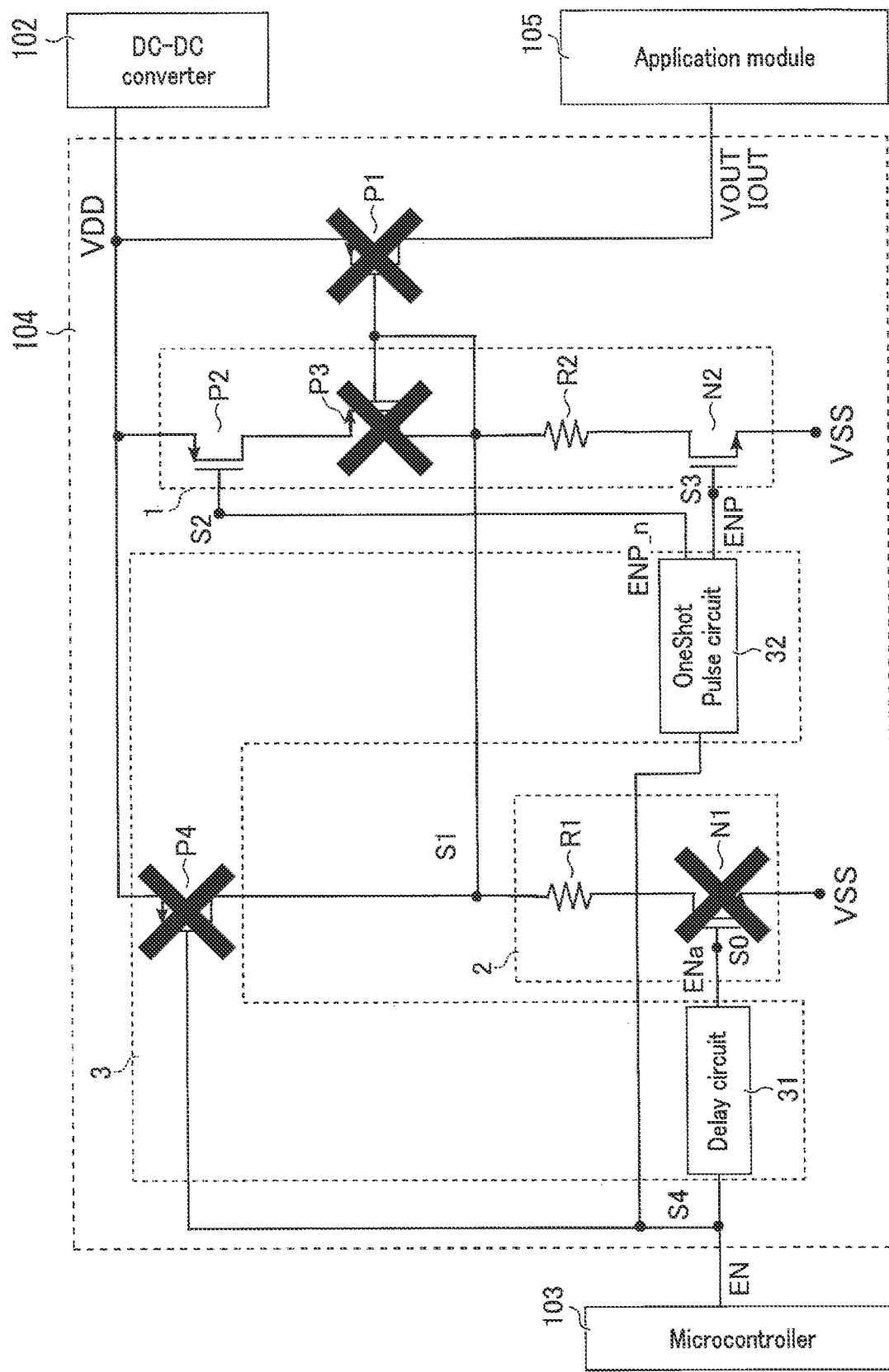
FIG. 6 is a circuit diagram showing an example of a state of coupling of the load switch IC according to the first embodiment during a period from time t1 to time t2.

An example of coupling of the load switch IC 104 at this time is shown in FIG. 6. FIG. 6 is a circuit diagram showing an example of a state of coupling of the load switch IC 104 according to the first embodiment during the period from time t1 to time t2. As shown in FIG. 6, over the period from time t1 to time t2, since the control signal EN is at a high level, the PMOS transistor P4 is at an off state.

Over the period from time t1 to time t2, since the delay signal ENa is at a low level, the NMOS transistor N1 is at an off state.

Over the period from time t1 to time t2, since the pulse signal ENP is at a high level, the NMOS transistor N2 is at an on state. Similarly, since the pulse signal ENP_n is at a low level, the PMOS transistor P2 is at an on state.

Specifically, at time t1, the NMOS transistor N2 starts shifting to an on state. Being brought to an on state, the NMOS transistor N2 commences releasing the charge stored in the node S1. The NMOS transistor N2 releases the charge stored in the node S1 via the resistance R2. With the charge released, the potential of the node S1 gradually decreases. However, the potential of the node S1 does not reach the activation voltage Von during the period until time t2.

Over the period from time t1 to time t2, since the potential of the node S1 does not reach the activation voltage Von, the switching PMOS transistors P1 and the PMOS transistor P3 are at an off state. Since the switching PMOS transistor P1 is at an off state, the output voltage VOUT is the ground voltage VSS over the period from time t1 to time t2.

At time t3, the delay circuit 31 brings the delay signal ENa to a high level, as shown in FIG. 4. Thereby, the NMOS transistor N1 is turned on, and the slew rate control circuit 2 commences operating. Time t3 is later than time t1 by Δt. Time t3 is slightly later than time t2.

At time t3, the one-shot pulse circuit 32 brings the pulse signal ENP to a low level. On the other hand, the one-shot pulse circuit 32 brings the pulse signal ENP_n to a high level. Thereby, the NMOS transistor N2 is turned off, and the control of the potential of the node S1 by the NMOS transistor N2 is stopped. The time when the NMOS transistor N2 is turned off may be set at a time later than time t3, and such an example will be shown in a modification.

At time t3, the potential of the node S1 reaches the activation voltage Von. Thereby, the switching PMOS transistor P1 is turned on.

From time t3, the potential of the node S1 continues to decrease under the control of the slew rate control circuit 2. At this time, the potential of the node S1 decreases by, for example, a certain magnitude per unit of time. The degree of decrease of the potential of the node S1 depends on the magnitude of the resistance R1 and the driving capability of the NMOS transistor N1. For example, an amount of decrease per unit time of the potential of the node S1 is smaller over the period from time t3 to time t5 than the period from time t1 to time t2. That is, the amount of decrease per unit time of the potential of the node S1 is larger in the case of driving the pre-discharge circuit 1 than in the case of driving the slew rate control circuit 2. This is for the purpose of preventing a current from abruptly flowing to the application module 105 as a result of a voltage equal to or lower than the activation voltage Von being abruptly applied to the node S1. Details will be discussed later.

Based on the switching PMOS transistor P1 being turned on, the output voltage VOUT starts to rise from the ground voltage VSS at time t3.

The rising of the output voltage VOUT continues from time t3 to time t4. At time t4, the output voltage VOUT rises to a voltage Vm. In other words, the output voltage VOUT starts to rise at time t3, and reaches the voltage Vm at time t4. The voltage Vm is a value dependent on the load of the application module 105. At this time, the output voltage VOUT rises by, for example, a certain magnitude per unit time. The output voltage VOUT maintains the voltage Vm after reaching the voltage Vm at time t4.

The potential of the node S1 continues to decrease from time t3, and reaches the ground voltage VSS at time t5.

Figure 7:
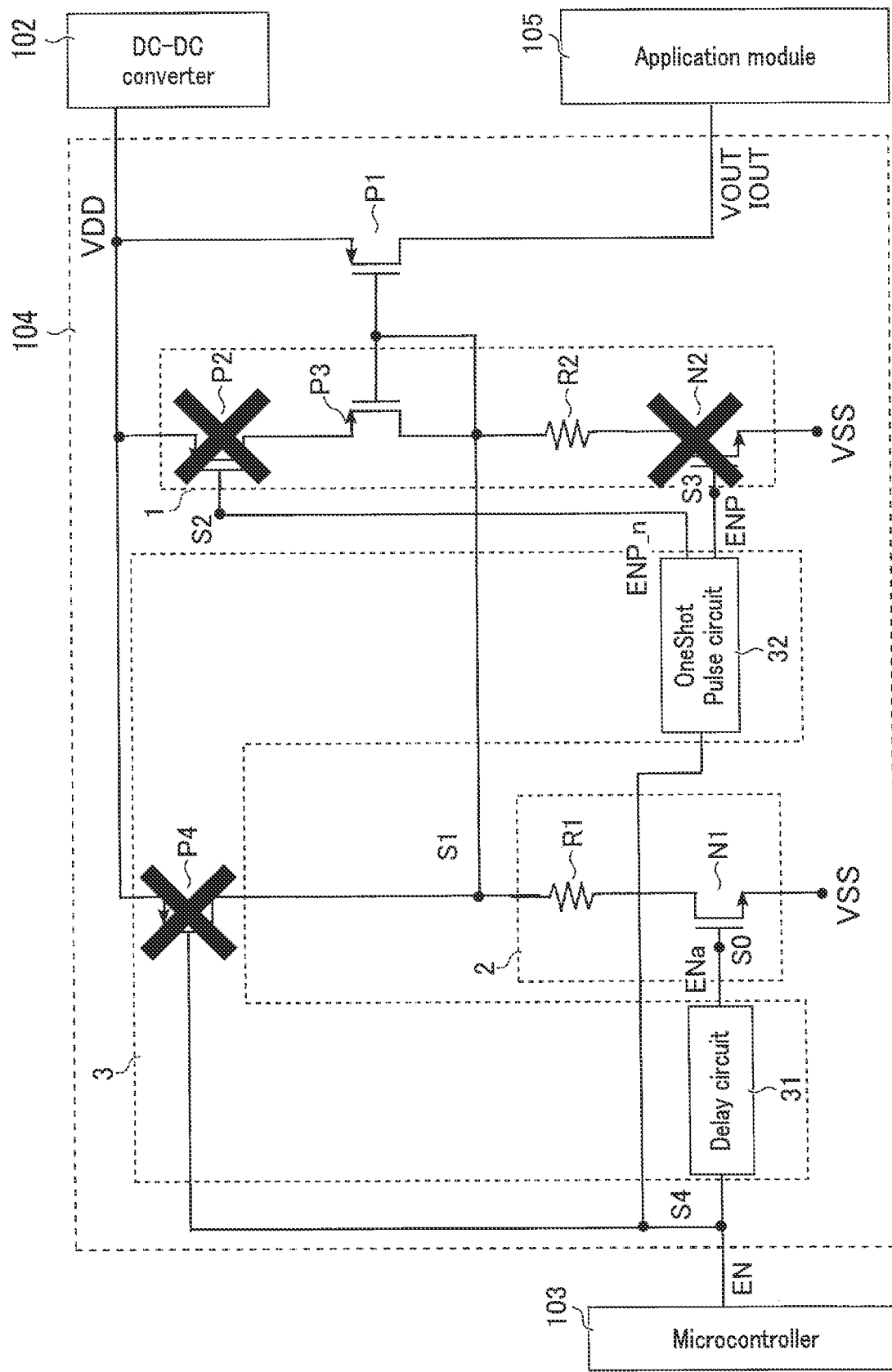
FIG. 7 is a circuit diagram showing an example of a state of coupling of the load switch IC according to the first embodiment during a period from time t3 to time t6.

An example of coupling of the load switch IC 104 at this time is shown in FIG. 7. FIG. 7 is a circuit diagram showing an example of a state of coupling of the load switch IC 104 according to the first embodiment during the period from time t3 to time t6 after time t5. As shown in FIG. 7, over the period from time t3 to time t6, since the control signal EN is at a high level, the PMOS transistor P4 is at an off state.

Over the period from time t3 to time t6, since the delay signal ENa is at a high level, the NMOS transistor N1 is at an on state.

At time t3, being brought to an on state, the NMOS transistor N1 commences releasing the charge stored in the node S1. The NMOS transistor N1 releases the charge stored in the node S1 via the resistance R1. With the charge released, the potential of the node S1 gradually decreases, and reaches the ground voltage VSS at time t5.

In this manner, the load switch IC 104 according to the first embodiment causes the pre-discharge circuit 1 to lower the potential of the node S1 to the activation voltage Von, and then operates the slew rate control circuit 2.

Over the period from time t3 to time t6, since the pulse signal ENP is at a low level, the NMOS transistor N2 is at an off state. Similarly, since the pulse signal ENP_n is at a high level, the PMOS transistor P2 is at an off state. If the PMOS transistor P3 were brought to an on state while the NMOS transistor N2 and the PMOS transistor P2 were at an on state, a through current might flow between the node VDD and the node VSS. The load switch IC 104 according to the first embodiment is capable of suppressing a through current by bringing the NMOS transistor N2 and the PMOS transistor P2 to an off state during the period from time t3 to time t6.

At time t3, since the potential of the node S1 reaches the activation voltage Von, the switching PMOS transistor P1 and the PMOS transistor P3 are kept in an on state. Thereafter, over the period from time t3 to time t6, since the potential of the node S1 continues to fall, the switching PMOS transistor P1 and the PMOS transistor P3 are constantly at an on state.

As shown in FIG. 4, at time t6, the microcontroller 103 starts shifting the control signal EN to a low level. Based on the control signal EN shifting to a low level, the PMOS transistor P4 is brought to an on state.

The delay signal ENa is not delayed from the control signal EN upon switching of the control signal EN from a high level to a low level, as described above. Accordingly, based on the control signal EN shifting to a low level, the delay circuit 31 brings the delay signal ENa to a low level. Based on the delay signal ENa being brought to a low level, the NMOS transistor N1 is brought to an off state.

If a delay time occurs, the NMOS transistor N1 is turned off later than when the PMOS transistor P4 is turned on, causing a through current to be generated between the node VDD and the node VSS. The load switch IC 104 according to the first embodiment is capable of suppressing a through current by not providing a delay time upon switching of the control signal EN from high to low.

Based on the NMOS transistor N1 being brought to an off state, the potential of the node S1 rises to the power-supply voltage VDD.

Based on the potential of the node S1 rising to the power-supply voltage VDD, the switching PMOS transistor P1 is turned off, and the output voltage VOUT decreases to the ground voltage VSS.

<1-3> Advantages (Advantageous effects) of First Embodiment

With the load switch IC 104 according to the first embodiment described above, when the load switch IC 104 is brought to an on state, it is possible to prevent a current from flowing to the application module 105 abruptly, and to perform activation of the load switch IC 104 quickly. Hereinafter, detailed effects of the load switch IC 104 according to the first embodiment will be described.

The period of time taken to activate the load switch IC 104 may be referred to as an "output-on time ton1". The expression "the load switch IC 104 is activated" means that the switching PMOS transistor P1 is turned on. An output-on time ton1 is a period of time taken to turn on the switching PMOS transistor P1 after the control signal EN is turned on. That is, an output-on time ton1 of the load switch IC 104 is a period of time from time t1 to time t3. A current abruptly flowing to the application module 105 means that the output current IOUT becomes abruptly large.

FIG. 8 shows an example of a circuit configuration in a load switch IC 111 according to a comparative example of the first embodiment. The load switch IC 111 according to the comparative example differs from the load switch IC 104 (FIG. 3) according to the first embodiment mainly in that the pre-discharge circuit 1, the delay circuit 31, and the one-shot pulse circuit 32 are not provided. The other structures of the load switch IC 111 are substantially identical to those of the load switch IC 104. Hereinafter, the structures of the load switch IC 111 will be described, mainly in terms of matters differing from the load switch IC 104. Details of signals will be discussed later with reference to FIG. 9.

As shown in FIG. 8, a gate of a switching PMOS transistor P1 is coupled to a node S1. If the switching PMOS transistor P1 is on, an output voltage VOUT is applied to an application module 105, and an output current IOUT flows thereto.

A slew rate control circuit 2 of the load switch IC 111 according to the comparative example includes a resistance R1 and an NMOS transistor N1, similarly to the slew rate control circuit 2 of the load switch IC 104. A gate of the NMOS transistor N1 receives a control signal EN from a node S4. The NMOS transistor N1 is brought to an on state if the control signal EN is at a high level, and is brought to an off state if the control signal EN is at a low level.

Figure 9:
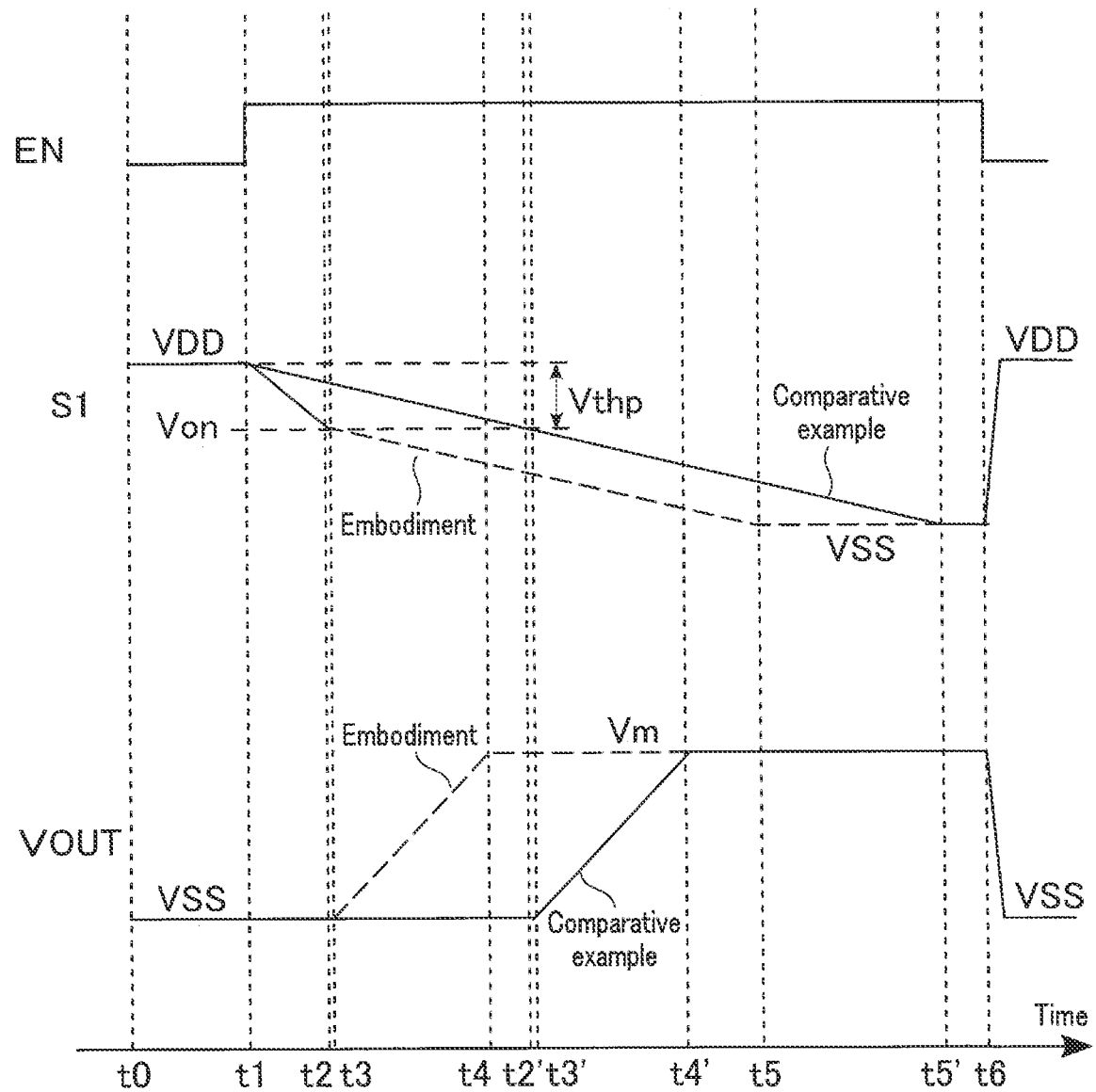

FIG. 9 is a timing chart showing, along a timeline, states of some signals upon switching of the load switch IC 111 according to the comparative example of the first embodiment from off to on. In the timing chart of FIG. 9, the control signal EN, the potential of the node S1, and the output voltage VOUT in the load switch IC 111 are shown. FIG. 9 also shows the potential of the node S1 and the state of the output voltage VOUT in the load switch IC 104 shown in FIG. 4 for comparison. Hereinafter, matters differing from the waveform of the load switch IC 104 according to the first embodiment will be mainly described.

Over the period from time t0 inclusive to time t1, since the control signal EN is at a low level, and the PMOS transistor P4 is at an on state. The NMOS transistor N1 is at an off state. Accordingly, similarly to the first embodiment, the switching PMOS transistor P1 is at an off state, and the output voltage VOUT is, for example, the ground voltage VSS.

At time t1, the microcontroller 103 starts shifting the control signal EN to a high level. Based on the control signal EN being shifted to a high level, the NMOS transistor N1 is brought to an on state. Therefore, at time t1, the potential of the node S1 starts to decrease from the power-supply voltage VDD under the control of the slew rate control circuit 2. At this time, the potential of the node S1 decreases by, for example, a certain magnitude per unit of time. The degree of decrease of the potential of the node S1 depends on the magnitude of the resistance R1 and the driving capability of the NMOS transistor N2.

The potential of the node S1 starts to decrease at time t1; however, the potential of the node S1 does not reach the activation voltage Von during the period from time t1 to time t2'. Accordingly, during the period from time t1 to time t2', the switching PMOS transistor P1 is at an off state, and the output voltage VOUT is the ground voltage VSS.

Over the period from time t1 to time t2', since the control signal EN is at a high level, the NMOS transistor N1 is at an on state. Specifically, at time t1, the NMOS transistor N1 starts shifting to an on state. Being brought to an on state, the NMOS transistor N1 commences releasing the charge stored in the node S1. With the charge released, the potential of the node S1 gradually decreases. However, the potential of the node S1 does not reach the activation voltage Von until time t2'.

At time t3', the potential of the node S1 reaches the activation voltage Von. Thereby, the switching PMOS transistor P1 is turned on. Time t3' is slightly later than time t2'.

The amount of decrease per unit time of the potential of the node S1 is larger in the case of driving the pre-discharge circuit 1 than in the case of driving the slew rate control circuit 2, as described above. The load switch IC 111 causes the slew rate control circuit 2 to decrease the potential of the node S1 to the activation voltage Von. The load switch IC 104 causes the pre-discharge circuit 1 to decrease the potential of the node S1 to the activation voltage Von. Accordingly, time t3' when the potential of the node S1 at the load switch IC 111 reaches the activation voltage Von is later than time t3 when the potential of the node S1 at the load switch IC 104 reaches the activation voltage Von. Accordingly, time t2' is later than time t2.

At time t3', since the control signal EN is at a high level, the NMOS transistor N1 continues to be at an on state. The potential of the node S1 continues to decrease under the control of the slew rate control circuit 2. Over the period from time t1 to time t5', the potential of the node S1 decreases by, for example, a certain magnitude per unit time. At time t5', the potential of the node S1 reaches the ground voltage VSS. Since time t3' is later than time t3, time t5' is later than time t5.

In this manner, the load switch IC 111 according to the comparative example of the first embodiment causes the slew rate control circuit 2 to lower the potential of the node S1 to the activation voltage Von, and continues to operate the slew rate control circuit 2 thereafter.

The load switch IC 111 is controlled by the slew rate control circuit 2 over the period from time t1 to time t5', and the load switch IC 104 is controlled by the slew rate control circuit 2 over the period from time t3 to time t5. Accordingly, the amounts of decrease per unit time of the potential of the node S1 over the period from time t1 to time t5' of the load switch IC 111 and over the period from time t3 to time t5 of the load switch IC 104 are, for example, the same.

Based on the switching PMOS transistor P1 being turned on, the output voltage VOUT starts to rise from the ground voltage VSS at time t3'. The rising of the output voltage VOUT continues from time t3' to time t4'. The output voltage VOUT rises by the same amount of rising per unit time as that over the period from time t3 to time t4 of the load switch IC 104.

In this manner, the potential of the node S1 of the load switch IC 111 decreases from the power-supply voltage VDD to the activation voltage Von under the control of the slew rate control circuit 2. Accordingly, the time when the node S1 of the load switch IC 111 reaches the activation voltage Von is time t3', which is later than time t3. Time t3 is when the node S1 of the load switch IC 104 according to the first embodiment reaches the activation voltage Von. That is, the potential of the node S1 of the load switch IC 111 may take a long time to reach the activation voltage Von, compared to the potential of the node S1 of the load switch IC 104. That is, the time taken for the load switch IC 111 to be turned on may be longer than the time taken for the load switch IC 104 to be turned on. In other words, an output-on time ton1 of the load switch IC 111 may be longer than that of the load switch IC 104.

The slew rate control circuit 2 has a function of applying a gradually changing voltage to the node S1 to prevent an abrupt increase of the output current IOUT, as described above. Accordingly, if the slew rate control circuit 2 is omitted from the load switch IC to shorten the output-on time ton1, the output current IOUT may abruptly increase, causing a breakdown, etc. of the application module 105.

On the other hand, the load switch IC 104 according to the first embodiment includes the pre-discharge circuit 1 and the slew rate control circuit 2 in the load switch IC. The pre-discharge circuit 1 lowers the potential of the node S1 at a high speed, compared to the slew rate control circuit 2. Accordingly, the load switch IC 104 according to the first embodiment, which can use the pre-discharge circuit 1, is capable of shortening the output-on time ton1 compared to the case of using only the slew rate control circuit 2 as in the comparative example.

The load switch IC 104 according to the first embodiment causes the pre-discharge circuit 1 to lower the potential of the node S1 to the activation voltage Von, and then operates the slew rate control circuit 2, as described above. The potential of the node S1 is lowered by the pre-discharge circuit 1 until the potential of the node S1 reaches the activation voltage Von, namely, until the switching PMOS transistor P1 is turned on. Accordingly, even if the potential of the node S1 is rapidly lowered by the pre-discharge circuit 1, the output current IOUT does not abruptly flow to the application module 105.

The load switch IC 104 causes the slew rate control circuit 2 to lower the potential of the node S1 after the potential of the node S1 reaches the activation voltage Von. Accordingly, the potential of the node S1 can be moderately lowered, preventing an abrupt increase of the output current IOUT.

That is, the load switch IC 104 can shorten the output-on time ton1, compared to the load switch IC 111, and prevent an abrupt increase of the output current IOUT.

This is because the load switch IC 104 including the pre-discharge circuit 1 and the slew rate control circuit 2 is capable of separately controlling the output-on time ton1 and the output current IOUT. Specifically, the load switch IC 104 causes the pre-discharge circuit 1 to mainly control the output-on time ton1, and causes the slew rate control circuit 2 to mainly control the output current IOUT. Thereby, the load switch IC 104 can control the output current IOUT without depending on the output-on time ton1.

In addition, the load switch IC 104 according to the first embodiment is capable of suppressing a through current by keeping the NMOS transistor N2 and the PMOS transistor P2 to an off state over the period from time t3 to time t6. The load switch IC 104 according to the first embodiment can be activated in an energy-saving manner by suppressing a through current.

<2> Modifications of First Embodiment

First Example

In the above-described first embodiment, a case has been described where the timing of turning off the NMOS transistor N2 and the PMOS transistor P2 and the timing of turning on the NMOS transistor N1 are the same (time t3). However, the behaviors of the NMOS transistor N2, the PMOS transistor P2, and the NMOS transistor N1 are not limited thereto. For example, the NMOS transistor N2 and the PMOS transistor P2 may be brought to an off state after a predetermined period of time has passed since the NMOS transistor N1 is turned on.

Figure 10:
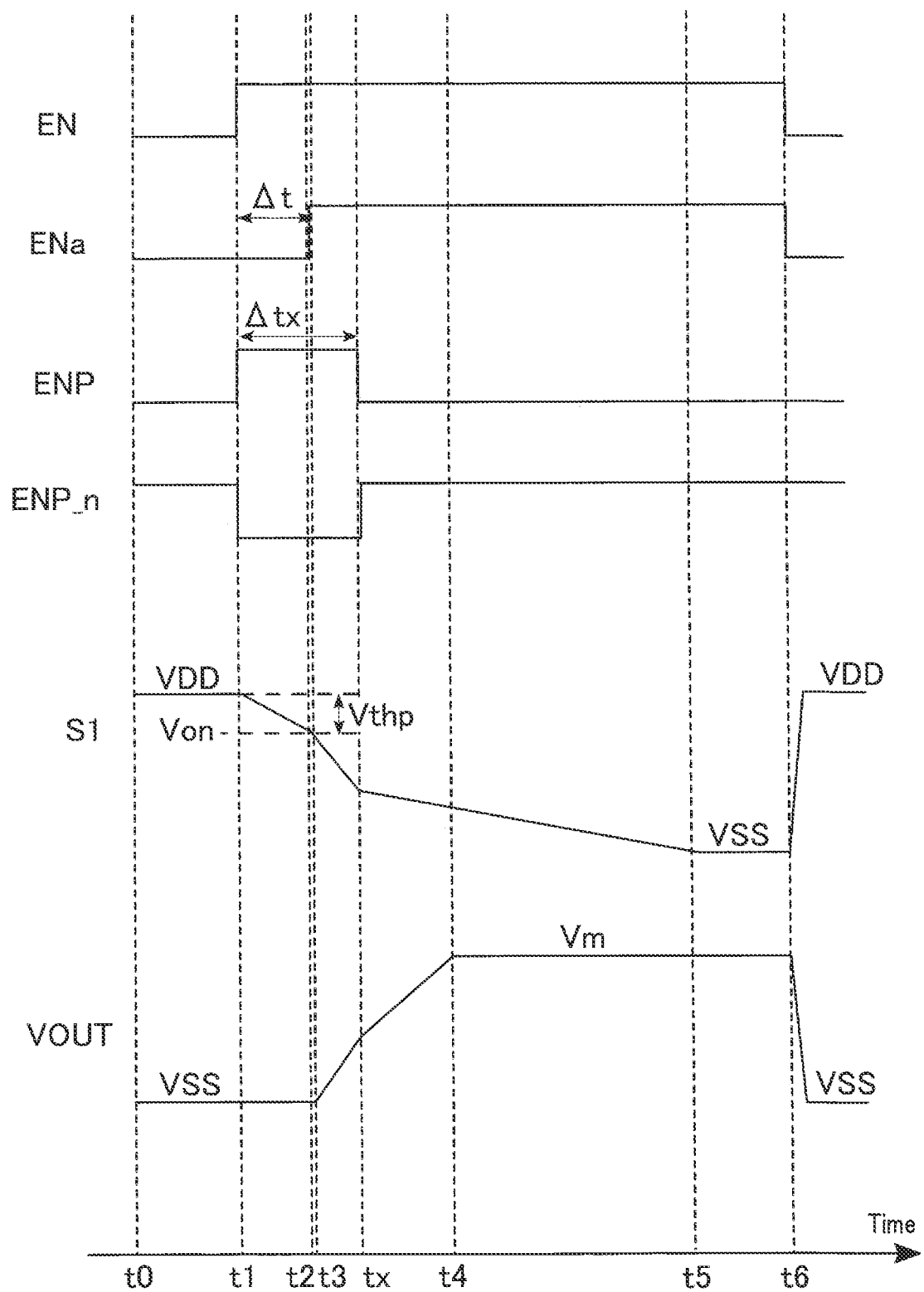

FIG. 10 is a timing chart showing, along a timeline, states of some signals upon switching of the load switch IC 104 according to a modification of the first embodiment from off to on. A control signal EN, a delay signal ENa, a pulse signal ENP, a pulse signal ENP_n, a potential of a node S1, and an output voltage VOUT are similar to those described with reference to FIG. 4, and a description thereof will be omitted.

In the load switch IC 104 according to the first embodiment, a case has been described where the pulse of the pulse signal ENP is brought to a low level and the pulse of the signal ENP_n is brought to a high level at time t3. In the load switch IC 104 according to the modification of the first embodiment, the pulse of the pulse signal ENP is brought to a low level and the pulse of the pulse signal ENP_n is brought to a high level at time tx. The time tx is later than time t3 and earlier than time t4.

In other words, in the load switch IC 104 according to the modification, the pulse widths of the pulse signals ENP and ENP_n are $\Delta$tx. The pulse width $\Delta$tx is longer than the delay time $\Delta$t. That is, in the load switch IC 104 according to the modification of the first embodiment, the pulse widths of the pulse signals ENP and ENP_n are greater than the pulse widths of the pulse signals ENP and ENP_n in the load switch IC 104 according to the first embodiment.

By setting the pulse widths of the pulse signals ENP and ENP_n, the one-shot pulse circuit 32 controls a period of time over which the NMOS transistor N2 and the PMOS transistor P2 of the pre-discharge circuit 1 are on, as described above. By setting the delay time $\Delta$t, the delay circuit 31 controls a period of time over which the NMOS transistor N1 of the slew rate control circuit 2 is on, as described above.

That is, according to the modification of the first embodiment, the timing (time tx) of turning off the NMOS transistor N2 and the PMOS transistor P2 is later than the timing (time t3) of turning on the NMOS transistor N1.

In the load switch IC 104 according to the first embodiment, an unintended delay may occur during, for example, the period from the turning off of the NMOS transistor N2 and the PMOS transistor P2 at time t3 until the turning on of the NMOS transistor N1. Examples of such an unintended reason include a delay caused by a time required to transmit a signal and variations in properties of transistors. In such a case, the switching PMOS transistor P1 may not be turned on by the pre-discharge circuit 1.

In the load switch IC 104 according to the modification, by delaying the time of turning off the NMOS transistor N2 and the PMOS transistor P2 from time t3 to time tx, it is possible to ensure a certain margin for an unintended delay. That is, even if an unintended delay occurs, it is possible to cause the pre-discharge circuit 1 to turn on the switching PMOS transistor P1.

However, over the period from time t3 to time tx, the potential of the node S1 is lowered by both the pre-discharge circuit 1 and the slew rate control circuit 2. Also, over the period from time t3 to time tx, the NMOS transistor N2 and the PMOS transistor P2 are at an on state, and the PMOS transistor P3 is also at an on state. Accordingly, a through current may be generated between the node VDD and the node VSS. On the other hand, it is possible to suppress a through current by making time tx as close as possible to time t3.

Second Example

In the first embodiment, a case has been described where the threshold voltage of the PMOS transistor P3 is the threshold voltage Vthp, which is the same as the threshold voltage of the switching PMOS transistor P1. However, the threshold voltage of the PMOS transistor P3 may be set to a value lower than the threshold voltage Vthp.

The PMOS transistor P3 configures a current mirror together with the switching PMOS transistor P1, as described above. Accordingly, when the PMOS transistor P3 is turned on and a current flows therethrough, a current also flows through the switching PMOS transistor P1. Control may be performed to prevent such a current from increasing abruptly, namely, to prevent an abrupt increase of the output current IOUT.

In the load switch IC 104 according to the modification of the first embodiment, the threshold voltage of the PMOS transistor P3 is set to a value lower than the threshold voltage Vthp. Thereby, the load switch IC 104 according to the modification is capable of turning on the switching PMOS transistor P1 earlier than the PMOS transistor P3. Since the slew rate control circuit 2 operates after the switching PMOS transistor P1 is turned on (from time t3 inclusive), control is performed in such a manner that the output current IOUT does not increase abruptly. That is, the load switch IC 104 according to the modification is configured in such a manner that the PMOS transistor P3 is not turned on before the slew rate control circuit 2 operates. Accordingly, the load switch IC 104 according to the modification may reduce the risk of an abrupt increase of the output current IOUT.

The load switch IC 104 according to the modification may reduce the risk in the current mirror structure of an abrupt increase of the output current IOUT by adjusting the gate length and/or the gate width of the PMOS transistor P3 and/or the switching PMOS transistor P1.

<3> Second Embodiment

Hereinafter, a load switch IC 104 according to a second embodiment will be described. The load switch IC 104 according to the second embodiment differs from the load switch IC 104 according to the first embodiment.
Hereinafter, the load switch IC 104 of the second embodiment may be referred to as a "load switch IC 104b" for distinction from the "load switch IC 104" of the first embodiment.

<3-1> Structure of Load Switch IC 104b

The load switch IC 104b according to the second embodiment differs from the load switch IC 104 according to the first embodiment mainly in terms of the structure of a delay circuit 31. Hereinafter, the delay circuit 31 of the second embodiment may be referred to as a "delay circuit 31b" for distinction from the delay circuit 31 of the first embodiment. The delay circuit 31b in the load switch IC 104b is synchronized with a one-shot pulse circuit 32. The other structures of the second embodiment are substantially identical to those of the first embodiment. Hereinafter, the load switch IC 104b according to the second embodiment will be described, mainly with respect to the matters differing from the first embodiment.

Figure 11:
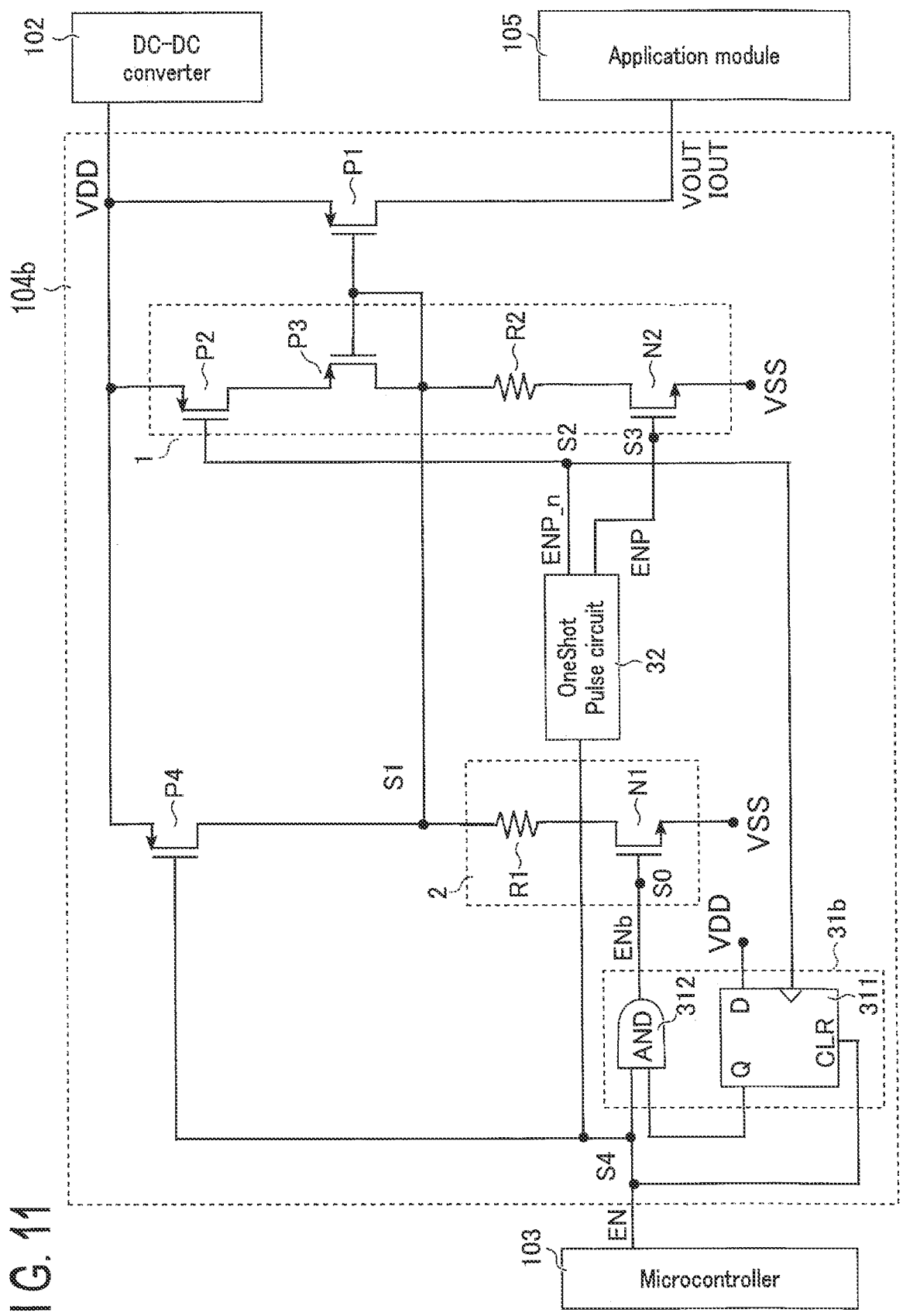
FIG. 11 is a circuit diagram showing an example of a circuit configuration of a load switch IC according to a second embodiment.

The structure of the delay circuit 31b will be described with reference to FIG. 11. FIG. 11 is a circuit diagram showing a configuration example of the load switch IC 104b according to the second embodiment. In the first embodiment, the delay circuit 31 and the one-shot pulse circuit 32 operate in an asynchronous manner. Accordingly, the delay circuit 31 operates based on the preset delay time Δt, and generates a delay signal ENa. In the second embodiment, on the other hand, the delay circuit 31b operates triggered by a pulse signal ENP_n transmitted from the one-shot pulse circuit 32. That is, the delay circuit 31b is synchronized with the one-shot pulse circuit 32.

As shown in FIG. 11, the delay circuit 31b includes a flip-flop circuit 311 and an AND gate 312. Details of signals will be discussed later with reference to FIG. 12.

The flip-flop circuit 311 outputs a signal supplied to a data input end D, a signal generated based on the pulse signal ENP_n, etc. from an output end Q. Hereinafter, a signal output from the output end Q may be referred to as an "output signal Q". The data input end D of the flip-flop circuit 311 is coupled to a node of the power-supply voltage VDD. A clock input end CK of the flip-flop circuit 311 is coupled to a node S2. The clock input end CK of the flip-flop circuit 311 receives the pulse signal ENP_n transmitted from the one-shot pulse circuit 32. The pulse signal ENP_n is used as a clock signal in the flip-flop circuit 311. The flip-flop circuit 311 stores a level of a signal supplied to the data input end D upon switching of the pulse signal ENP_n from a low level to a high level, and outputs the stored level from the output end Q, namely, switches the output signal Q to a high level. The output signal Q switched to a high level maintains a high-level state until the data stored in the flip-flop circuit 311 is reset under conditions that will be discussed later.

A reset signal input end CLR of the flip-flop circuit 311 receives a control signal EN from the node S4. The flip-flop circuit 311 resets the data stored in the flip-flop circuit 311 if the control signal EN received from the reset signal input end CLR is brought to a low level, and keeps outputting a low-level signal.

A first input end of the AND gate 312 receives the control signal EN from the node S4. A second input end of the AND gate 312 receives an output signal Q from the flip-flop circuit 311. An output end of the AND gate 312 is coupled to a node S0. The AND gate 312 transmits, from the output end to the node S0, a delay signal ENb, which is a logical product of the signal received from the first input end and the signal received from the second input end. A gate of the NMOS transistor N1 receives the delay signal ENb from the node S0.

<3-2> Operation

Figure 12:
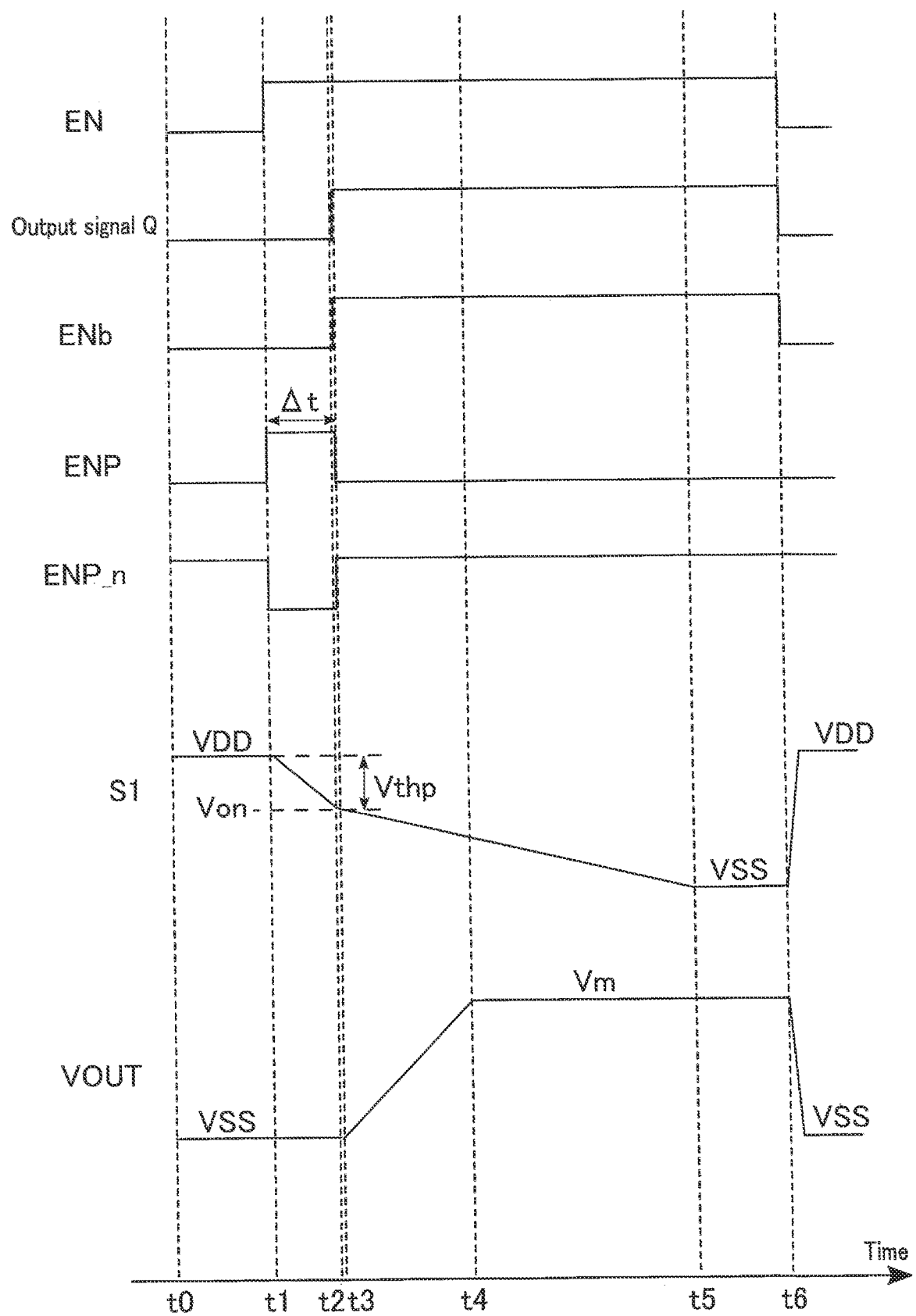

FIG. 12 is a timing chart showing, along a timeline, states of some signals upon switching of the load switch IC 104b according to the second embodiment from off to on. The control signal EN, a pulse signal ENP, the pulse signal ENP_n, a potential of a node S1, and an output voltage VOUT are similar to those described with reference to FIG. 4, and a description thereof will be omitted. Hereinafter, a description will be given mainly of a delay signal ENb and an output signal Q.

At time t0, the flip-flop circuit 311 is in a reset state, and maintains the output signal Q at a low level. At time to, since the control signal EN is at a low level and the output signal Q is at a low level, the AND gate 312 maintains the delay signal ENb at a low level.

At time t1, the microcontroller 103 starts shifting the control signal EN to a high level. At time t1, the flip-flop circuit 311 is in a reset state, and maintains the output signal Q at a low level. Over the period after time t1 and prior to time t2, since the control signal EN is at a high level and the output signal Q is at a low level, the AND gate 312 maintains the delay signal ENb at a low level.

At time t2, the pulse signal ENP_n is at a low level. Accordingly, the output signal Q is at a low level. At time t2, since the control signal EN is at a high level and the output signal Q is at a low level, the AND gate 312 maintains the delay signal ENb at a low level.

At time t3, the pulse signal ENP_n switches from a low level to a high level. The flip-flop circuit 311 switches the output signal Q to a high level upon switching of the pulse signal ENP_n from a low level to a high level, as described above. Accordingly, at time t3, the output signal Q shifts from a low level to a high level.

At time t3, since the control signal EN is at a high level and the output signal Q is at a high level, the AND gate 312 shifts the delay signal ENb to a high level.

At time t6, the microcontroller 103 starts shifting the control signal EN to a low level. When the received control signal EN shifts to a low level, the flip-flop circuit 311 maintains the output signal Q at a low level, as described above. Based on the control signal EN being shifted to a low level, the flip-flop circuit 311 shifts the output signal Q from a high level to a low level. At this time, since the control signal EN is at a low level and the output signal Q is at a low level, the AND gate 312 maintains the delay signal ENb at a low level.

As described above, the timing chart of the delay signal ENb is similar to the timing chart of the delay signal ENa. Accordingly, the timing chart of the potential of the node S1 and the output voltage VOUT and the behavior of each transistor are similar to those described with reference to FIG. 4, and the description thereof will be omitted.

<3-3> Advantages (Advantageous effects) of Second Embodiment

With the load switch IC 104b according to the second embodiment described above, it is possible to shorten the output-on time ton1 of the load switch IC 104b, and to prevent an abrupt increase of the output current IOUT, similarly to the first embodiment. Furthermore, with the load switch IC 104b according to the second embodiment, the timing of driving the slew rate control circuit 2 can be synchronized with the behavior of the pre-discharge circuit 1.

With the load switch IC 104b according to the second embodiment, since the pre-discharge circuit 1 and the slew rate control circuit 2 are provided, it is possible to control the output current IOUT without depending on the output-on time ton1, similarly to the first embodiment. Accordingly, similarly to the first embodiment, the load switch IC 104b can shorten the output-on time ton1, compared to the load switch IC 111, and can prevent an abrupt increase of the output current IOUT.

Moreover, with the load switch IC 104b according to the second embodiment, it is possible to suppress a through current by keeping the NMOS transistor N2 and the PMOS transistor P2 in an off state during the period from time t3 to time t6, similarly to the first embodiment. The load switch IC 104b according to the second embodiment can be activated in an energy-saving manner by suppressing a through current.

In the first embodiment, the delay circuit 31 and the one-shot pulse circuit 32 operate in an asynchronous manner. Accordingly, when a margin is taken into account in the delay circuit 31 as in the modification, the potential of the node S1 may be lowered by both the slew rate control circuit 2 and the pre-discharge circuit 1.

In the second embodiment, on the other hand, the load switch IC 104b is capable of synchronizing the timing of driving the slew rate control circuit 2 with the behavior of the pre-discharge circuit 1. In the second embodiment, the delay circuit 31b operates when triggered by a pulse signal ENP_n transmitted from the one-shot pulse circuit 32, as described above. Through such an operation triggered by the pulse signal ENP_n, the delay circuit 31b is capable of turning off the NMOS transistor N2 and the PMOS transistor P2 and turning on the NMOS transistor N1 at time t3 in a synchronized manner.

Accordingly, the load switch IC 104b of the second embodiment need not adjust the pulse width $\Delta tx$ of the pulse signal ENP_n and the delay time $\Delta t$ of the delay signal ENa, unlike the modification of the first embodiment.

As a result, the load switch IC 104b of the second embodiment is capable of preventing a situation where the potential of the node S1 is lowered by both the slew rate control circuit 2 and the pre-discharge circuit 1. That is, the load switch IC 104b is capable of preventing an abrupt increase of the output current IOUT effectively, compared to the load switch IC 104 according to the first embodiment.

Furthermore, with the load switch IC 104b, it is possible to obviate a situation where the NMOS transistor N2 and the PMOS transistor P2 are at an on state and the PMOS transistor P3 is also at an on state. Accordingly, it is possible to prevent a through current from occurring between the node VDD and the node VSS.

<4> Other Modification, Etc.

In the first and second embodiments, the load switches IC 104 and 104b may have a structure other than those described above.

Herein, the term "couple" refers to electrical coupling, and does not exclude intervention of another element. Electrical coupling may have an insulator intervening by an insulator as long as such coupling is capable of operating in a manner similar to electrical coupling without intervention of an insulator.

The expression "substantially the same time" refers to a time including an error upon occurrence of an unintended delay due to, for example, a time for transmitting a signal.

The first and second embodiments described above have been presented by way of example only, and are not intended to limit the scope of the invention. The first and second embodiments may be embodied in a variety of other forms, and various omissions, substitutions and variations may be made without departing from the spirit of the invention. The first and second embodiments and their modifications are included in the scope and spirit of the invention and are included in the scope of the claimed inventions and their equivalents.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching device comprising:
a first p-type MOS transistor, a gate of the first p-type MOS transistor being coupled to a first node;
a first control circuit electrically coupled to the first node; and
a second control circuit electrically coupled to the first node, wherein
the first control circuit is configured to lower a voltage of the first node from a first time to a second time, the first p-type MOS transistor being at an off state at the first time,
the second control circuit is configured to lower the voltage of the first node during a first period from a third time to a fourth time, the first p-type MOS transistor being at an on state at the fourth time,
the second time is later than the first time,
the fourth time is later than the second time and the third time,
the first p-type MOS transistor is brought to an on state during the first period,
an amount of the voltage of the first node lowered per unit time in the first control circuit is greater than that in the second control circuit, and
the first control circuit includes:
a second p-type MOS transistor, one end of the second p-type MOS transistor being coupled to a voltage source;
a third p-type MOS transistor coupled between another end of the second p-type MOS transistor and the first node, a gate of the third p-type MOS transistor being coupled to the first node; and
a first n-type MOS transistor electrically coupled between the first node and a first power source which is of a voltage lower than a voltage of the voltage source.

2. The switching device according to claim 1, further comprising:
a pulse circuit which controls the first control circuit; and
a delay circuit which controls the second control circuit, wherein
the first p-type MOS transistor includes one end coupled to the voltage source,
the first control circuit further includes a first resistance electrically coupled between the first node and one end of the first n-type MOS transistor, and
the pulse circuit is coupled to a gate of the second p-type MOS transistor and to a gate of the first n-type MOS transistor.

3. The switching device according to claim 2, wherein
the delay circuit receives a first signal, and transmits a second signal to the second control circuit,
the delay circuit shifts the second signal from a low level to a high level at a time later than a time when the first signal shifts from a low level to a high level by a second period,
the pulse circuit receives the first signal, and transmits a third signal and a fourth signal to the gate of the second p-type MOS transistor and the gate of the first n-type MOS transistor,
the second control circuit starts lowering the voltage of the first node based on the second signal shifting from the low level to the high level,
the first signal shifts from the low level to the high level while the first p-type MOS transistor is at an off state,
the third signal includes a one-shot pulse that shifts from a high level to a low level based on the first signal shifting from the low level to the high level, and
the fourth signal includes a one-shot pulse that shifts from a low level to a high level based on the first signal shifting from the low level to the high level.

4. The switching device according to claim 3, wherein
the first control circuit starts lowering the voltage of the first node based on the fourth signal shifting from the low level to the high level.

5. The switching device according to claim 3, wherein
the delay circuit includes a flip-flop circuit, receives the third signal from the pulse circuit, and shifts the second signal from the low level to the high level based on the pulse of the third signal shifting from a low level to a high level.

6. The switching device according to claim 1, wherein the third time is identical to the second time.

7. The switching device according to claim 1, wherein the third time is later than the second time.

8. The switching device according to claim 3, wherein
the pulse circuit shifts the third signal from a high level to a low level, and shifts the fourth signal from a low level to a high level with the first signal shifting from a low level to a high level used as a trigger.

9. The switching device according to claim 8, wherein
a pulse width of each of the third signal and the fourth signal is a period equal to or longer than the second period.

* * * * *